United States Patent
Hinteresch et al.

(10) Patent No.: US 8,206,178 B2
(45) Date of Patent: Jun. 26, 2012

(54) ELECTRICAL APPLIANCE

(75) Inventors: Klaus Hinteresch, Schwerte (DE); Ruediger Knobloch, Luedenscheid (DE); Werner Koster, Schalksmuhle (DE)

(73) Assignee: Kostal Kontakt Systeme GmbH, Luedenscheid (DE)

( * ) Notice: Subject to any disclaimer, the term of this patent is extended or adjusted under 35 U.S.C. 154(b) by 0 days.

(21) Appl. No.: 13/152,929

(22) Filed: Jun. 3, 2011

(65) Prior Publication Data

US 2011/0244712 A1 Oct. 6, 2011

Related U.S. Application Data

(63) Continuation of application No. PCT/EP2009/066557, filed on Dec. 7, 2009.

(30) Foreign Application Priority Data

Dec. 9, 2008 (DE) .......................... 10 2008 061 234

(51) Int. Cl.
*H05K 5/00* (2006.01)
(52) U.S. Cl. .................................. 439/620.24; 361/809
(58) Field of Classification Search ............ 439/620.24, 439/620.25; 361/809, 811; 174/52.1
See application file for complete search history.

(56) References Cited

U.S. PATENT DOCUMENTS

| 3,881,961 | A | 5/1975 | Nation |
| 5,044,988 | A | 9/1991 | Hirayama |
| 5,171,165 | A | 12/1992 | Hwang |
| 5,707,249 | A | 1/1998 | Byrd |
| 6,163,460 | A | 12/2000 | Baur et al. |
| 6,300,564 | B1 * | 10/2001 | Moraes et al. ................. 174/535 |

FOREIGN PATENT DOCUMENTS

| CA | 1023798 A1 | 1/1978 |
| DE | 19829920 A1 | 5/1999 |

* cited by examiner

*Primary Examiner* — Gary F. Paumen
(74) *Attorney, Agent, or Firm* — Brooks Kushman P.C.

(57) ABSTRACT

An electrical appliance includes a housing having a holding chamber and an insert slot, an insulation displacement connector (IDC), and an electrical component such as a battery inserted into the holding chamber. The component has an electric connector extending through the holding chamber into the insert slot. Upon insertion of the IDC into the insert slot, the IDC contacts the electric connector of the component and contacts a printed circuit board (PCB) mounted to the housing whereby the electrical component and the PCB are electrically connected via the electric connector of the component and the IDC. The holding chamber completely surrounds, at least in sections, the component within the holding chamber. The holding chamber includes a radially-pivotable latching clip which axially fixes in place the component within the holding chamber.

19 Claims, 4 Drawing Sheets

ELECTRICAL APPLIANCE

CROSS-REFERENCE TO RELATED APPLICATIONS

This application is a continuation of International Application No. PCT/EP2009/066557, published in German, with an international filing date of Dec. 7, 2009, which claims priority to DE 10 2008 061 234.0, filed Dec. 9, 2008; the disclosures of which are incorporated by reference.

TECHNICAL FIELD

The present invention relates to an electrical appliance having a housing, an insulation displacement connector (IDC) held within a slot of the housing, and an electrical component held within a holding chamber of the housing in which an electrical connector of the component is connected to the IDC in order to connect the component to a printed circuit board that is held to the housing and is connected to the IDC.

BACKGROUND

DE 198 29 920 A1 (corresponds to U.S. Pat. No. 6,163,460) describes an electrical appliance having a housing, an insulation displacement connector (IDC) held to the housing, and an electrical component held to the housing. Plastic straps are integrally molded onto the base of the housing. The straps surround the component in a tong-like manner to hold the component to the housing. The IDC is inserted into a retaining pocket integrally molded on the housing in order to be held to the housing. Upon insertion into the retaining pocket, the IDC contacts a connecting wire of the component and concurrently integrally forms a press-fit contact that connects to a printed circuit board (PCB) held to the housing base.

The use of straps to fasten the electrical component in a tong-like manner is problematic if the component is relatively heavy and/or if the component is exposed to high mechanical loads due to vibrations or accelerations. This can cause the component to come loose from the plastic surface or be displaced inside the mounting such that the electrical connection to the IDC is mechanically stressed or even interrupted.

SUMMARY

An object of the present invention is an electrical appliance having a housing on which one or more relatively large and heavy electrical components can be mechanically mounted and electrically connected simply and securely.

In accordance with the above object and other objects, the present invention provides an electrical appliance having an insulation displacement connector and a housing is provided. The housing includes a holding chamber and an insert slot. The holding chamber is configured to receive an electrical component for holding the electrical component to the housing. The insert slot is configured to receive the insulation displacement connector (IDC) for holding the IDC to the housing. The holding chamber is further configured to completely surround, at least in sections, an electrical component received in the holding chamber. The holding chamber further includes a radially-pivotable latching clip which axially fixes in place an electrical component received in the holding chamber. The IDC is configured to electrically contact both of an electric connector of an electrical component received in the housing and a printed circuit board mounted to the housing upon insertion of the IDC into the insert slot In accordance with the above object and other objects, the present invention further provides an electrical appliance having a housing, an insulation displacement connector (IDC), and an electrical component. The housing has a holding chamber and an insert slot. The electrical component is inserted into the holding chamber. The electrical component has an electric connector extending through an aperture of the holding chamber into the region of the insert slot. Upon insertion of the IDC into the insert slot, the IDC contacts the electric connector of the electrical component and contacts a printed circuit board (PCB) mounted to the housing whereby the electrical component and the PCB are electrically connected via the electric connector of the electrical component and the IDC. The holding chamber completely surrounds, at least in sections, the electrical component within the holding chamber. The holding chamber includes a radially-pivotable latching clip which axially fixes in place the electrical component within the holding chamber.

Embodiments of the present invention provide an electrical appliance having a housing and at least one insulation displacement terminal contact (IDC). The housing includes a housing chamber and an integrally formed insert slot positioned adjacent the housing chamber. The housing chamber is for holding an electrical component. The insert slot is for holding the IDC. The IDC inserts into the slot in order to be joined to the housing. A printed circuit board (PCB) is positioned against the housing. Upon being inserted into the insert slot of the housing, the IDC connects with the PCB in order to mechanically hold the PCB to the housing. The component inserts into the holding chamber to be held on the housing. The holding chamber completely surrounds the envelope surface of the component, at least in places. An electrical connector of the component extends through an aperture of the holding chamber into the region of the insert slot of the housing. The electrical connector and the IDC connect with one another upon the IDC being inserted into the insert slot of the housing. As a result, the component and the PCB are electrically connected via the IDC and the electrical connector. A latching clip which can pivot radially is positioned at the opening of the holding chamber where the component inserts into the holding chamber. The latching clip fixes the component inserted into the holding chamber in the axial direction.

An electrical appliance in accordance with an embodiment of the present invention includes a housing having a holding chamber. The holding chamber extends along an axial direction. An electrical component is inserted along the axial direction into the holding chamber in order to be held to the housing. The holding chamber mechanically retains therein the component and completely surrounds the surface shell of the component, at least in sections. The holding chamber includes a latching clip positioned at the opening of the holding chamber where the component is to be inserted into the holding chamber. The latching clip is radially pivotable to enable the component to be inserted into the holding chamber and to fix the component within the holding chamber along the axial direction.

The electrical component may be an electric energy storage device such as a battery, an accumulator, a condenser, etc. Such components may be relatively large and heavy. For simplicity, it is assumed herein that each component has an essentially cylindrical shape. Correspondingly, it is assumed that each holding chamber of the housing has an essentially cylindrical shape. However, this assumed shape is not to limit any generality as the features in accordance with embodiments of the present invention can be made usable or transferrable to components having different geometric shapes without further difficulty.

Due to the complete enclosure of the surface shell of the electrical component within the holding chamber of the housing, the component is essentially form fitted with respect to its cross-sectional radial directions to within possible tolerance-related clearances between its surface shell and the holding chamber. Again, the complete enclosure of the surface shell of the electrical component can be provided in places, e.g., not extending over the entire axial dimension of the component. The component may also be enclosed over its entire axial extent by the walls of the holding chamber.

The aforementioned tolerance-related clearances can be compensated by providing the walls of the holding chamber with integrally molded protrusions projecting into the holding chamber. The protrusions press elastically against the outer surfaces of the component inserted into the holding chamber. These protrusions thereby act as vibration dampers for the component when the electrical appliance is moved. The protrusions are cast integrally on the housing.

Due to the enclosure surrounding the holding chamber by walls of the housing, the electrical component may insert into the holding chamber in the axial direction. The component is then secured by a radially pivotable latching clip inside the holding chamber. The latching clip is arranged on the edge of the holding chamber so that it projects into the holding chamber. The latching clip has an actuating bevel that increases in height in the direction of the holding chamber. The component is guided on the bevel during axial insertion into the holding chamber. The component thereby pivots the latching clip in the radial direction with respect to the transverse section of the holding chamber. Once the component is pushed over the latching clip, the latching clip springs back and thereby assures that the component is axially oriented in the holding chamber. The latching clip is secured against unlocking by the installation of the assembly on a printed circuit board.

The holding chamber or the electrical component to be mounted therein can include an elastically deformable body. Such a deformable body may be in the form of a gasket made of an elastomer. The deformable body is pressed together by the insertion of the component into the holding chamber and thereby produces a restoring force that pushes the component against the latching clip. Axial tolerance compensation is achieved in this manner through which axial displacements of the component in the holding chamber are hindered.

The holding chamber has at least one aperture. An electrical connector such as an electrical wire of the electrical component extends through the aperture to enable an electrical connection of the component with an electrical element external to the holding chamber. In particular, the electrical connector extends into the region of a slot of the housing. The slot is configured to receive an insulation displacement connector (IDC). Upon insertion of the IDC into the slot of the housing, the IDC connects with the electrical connector. As a result, the component and the IDC are electrically connected. Further, a printed circuit board (PCB) may be held to the housing. In this event, the IDC also connects with the PCB upon insertion of the IDC into the slot of the housing. As a result, the component and the PCB are electrically connected via the IDC and the electrical connector.

In embodiments of the present invention, the IDC has two IDC regions which are parallel to one another. Each IDC region contacts a single electrical connector of the component upon the IDC being inserted into the slot of the housing. A secure electrical connection of the component can be achieved by this double contacting procedure.

In embodiments of the present invention, the IDC simultaneously forms press-fit contacts that are established during insertion into the slot of the housing in recesses. In particular, the contacts are established in the interlayer connections of the PCB whereby a solder-free electrical connection is made to the PCB. The PCB is concurrently fastened mechanically to the housing.

In embodiments of the present invention, the IDC is formed by orienting the opening direction of the IDC parallel to the direction of extension of the press-fit contact. This enables contact of an electrical connector of the component and binding of the IDC with the PCB in a single operational step.

In embodiments of the present invention, a flat pin connector attachable to the housing is provided. The pin connector has at least one press-fit contact that can be connected to the PCB. The pin connector has the function of supporting the attachment of the PCB to the housing. The pin connector can create an electrical connection or can be used without an electrical function. The pin connector is likewise included in a slot formed on the housing and is secured by a spring projecting out of the plane of the pin connector.

The above features, and other features and advantages of the present invention are readily apparent from the following detailed description thereof when taken in connection with the accompanying drawings.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figure 1:
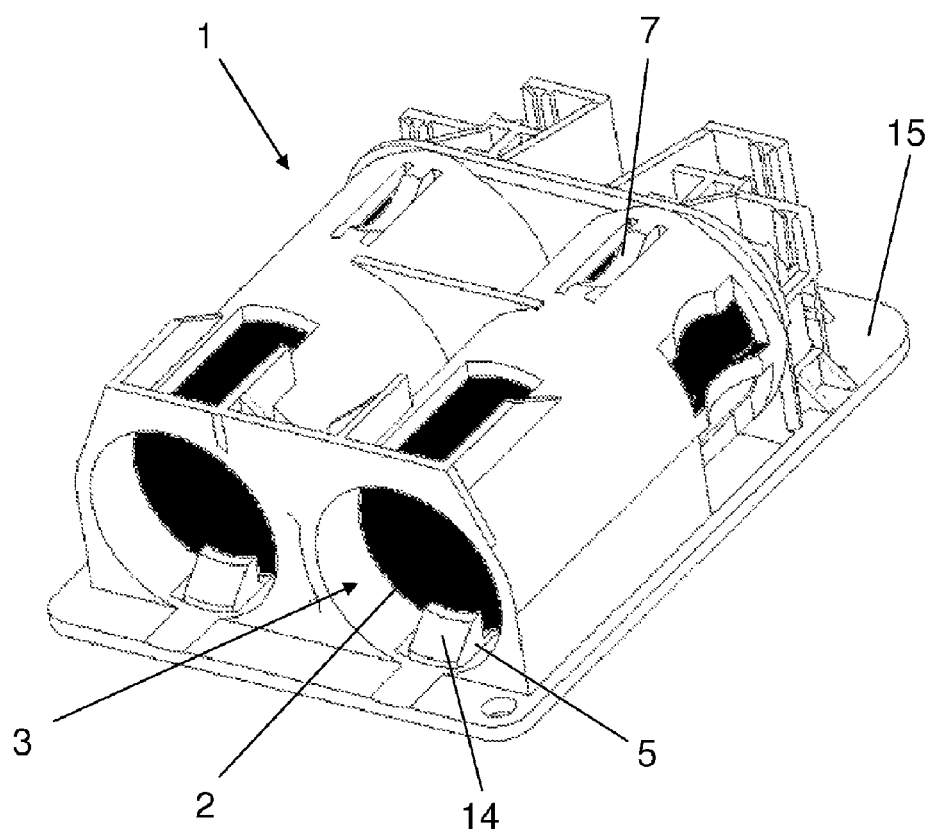
FIGS. 1, 2, and 3 illustrate respective views of an electrical appliance in accordance with an embodiment of the present invention.
Figure 2:
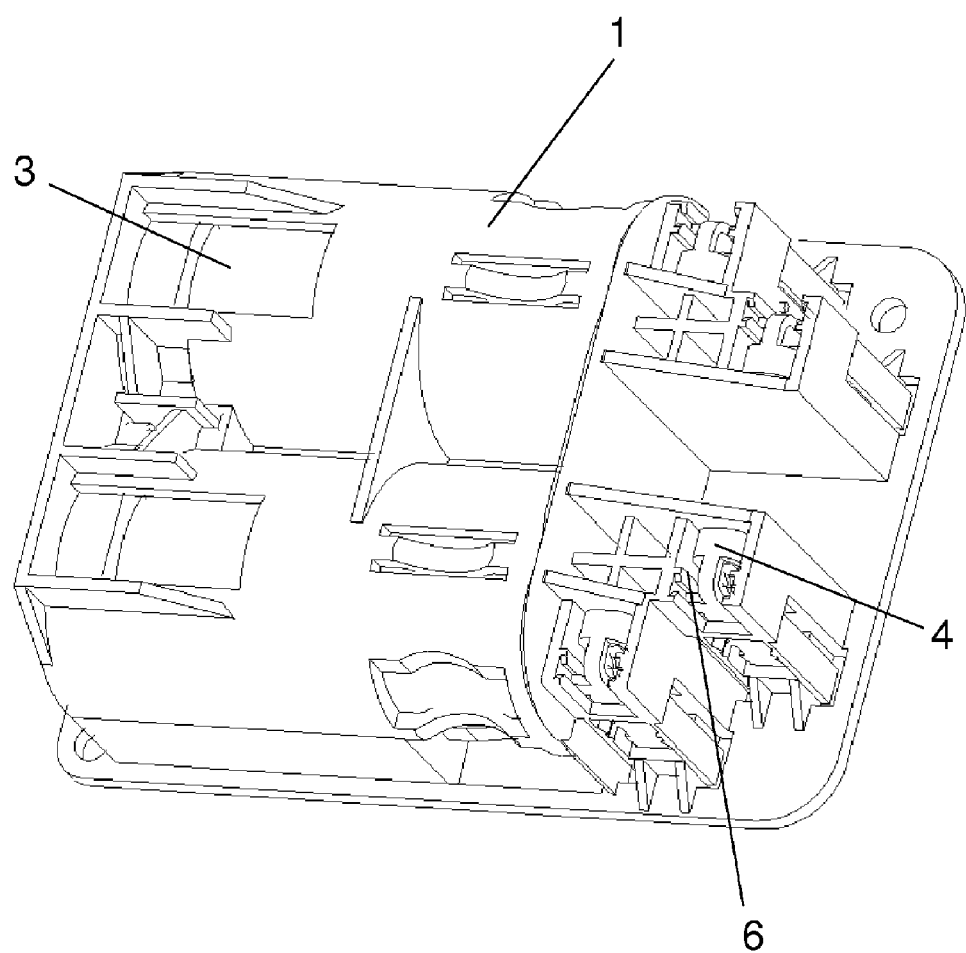
Figure 3:
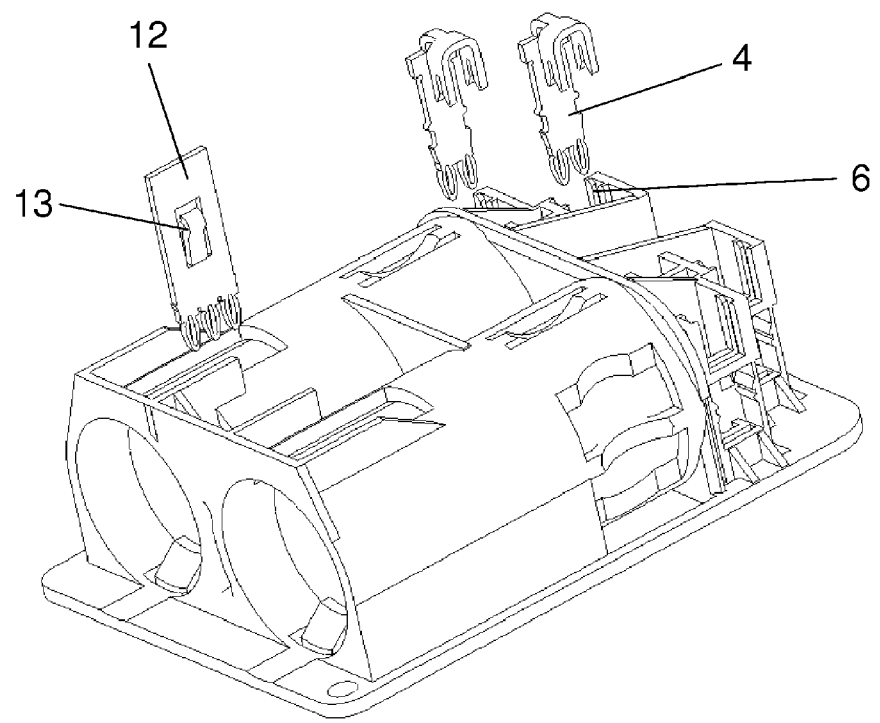

FIGS. 1, 2, and 3 illustrate respective views of an electrical appliance in accordance with an embodiment of the present invention. The electrical appliance includes a housing 1. Housing 1 is integrally molded of plastic. Housing 1 includes one or more holding chambers 3. Holding chamber 3 is integrally molded on a housing base 15 of housing 1. In this embodiment, holding chamber 3 is essentially cylindrical in shape. An electrical component 2 such as an accumulator or a condenser is placed in holding chamber 3. Two components 2 respectively positioned in two holding chambers 3 of housing 1 are indicated in FIG. 1 by their outer surfaces that are darkened. An electrical printed circuit board (PCB) (not shown) is arranged underneath housing base 15.

The shape of housing 1 is matched to the shape and size of component 2 such that component 2 just fits into holding chamber 3. In order to match the dimensional tolerances, at least one elastic molded protrusion 7 is placed on the wall of holding chamber 3. Protrusion 7 penetrates into the interior of holding chamber 3 and presses against the outer surface of component 2 inserted into the holding chamber. Protrusion 7 acts as a vibration damper during mechanical stresses on housing 1 for component 2 inserted into holding chamber 3.

A latching clip 5 is located in front of the opening side of holding chamber 3. Latching clip 5 is integrally molded elastically to housing 1. Latching clip 5 includes an actuating bevel 14. Component 2 presses against actuating bevel 14 of latching clip 5 during the insertion of component into holding chamber 3 whereby elastic latching clip 5 pivots downwards. After component 2 is pushed over latching clip 5 and is located entirely within holding chamber 3, latching clip 5 springs back into its original position thereby holding component 2 in holding chamber 3. Even a relatively heavy component 2 is thereby fixed securely inside holding chamber 3.

The electrical appliance further includes at least one insulation displacement connector or terminal contact (IDC) 4. Housing 1 includes at least one insert slot 6 configured to receive IDC 4. Insert slot 6 is positioned adjacent holding chamber 3. IDC 4 can insert into insert slot 6 and IDC 4 is held by insert slot 6 when inserted therein to be joined with housing 1. Further, IDC 4 is positioned adjacent holding chamber 3 when IDC 4 is inserted into insert slot 6.

Upon insertion into insert slot 6, IDC 4 contacts one or more electrical connectors of electrical component 2 held within holding chamber 3. The electrical connector of component 2 is formed, for example, as a connection wire. The electrical connector of component 2 extends through an aperture of holding chamber 3 into the region of insert slot 6. Component 2 and IDC 4 are electrically connected to one another through the contact of IDC 4 with the electrical connector of component 2.

Figure 4:
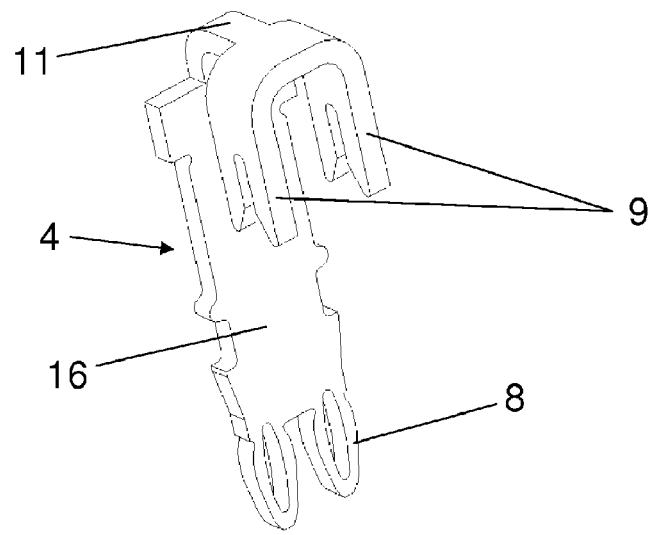
FIG. 4 illustrates a perspective view of an insulation displacement connector (IDC) of the electrical appliance.

In FIGS. 3 and 4, IDCs 4 are shown as individual parts. FIG. 3 illustrates two IDCs 4 located near insert slots 6 just before insertion into the insert slots for attachment with housing 1. FIG. 4 illustrates an enlarged perspective view of a IDC 4.

As best shown in FIG. 4, IDC 4 has two press-fit contacts 8, a pair of IDC regions 9, a bent connector section 11, and a flat section 16. IDC regions 9 are integrally connected to flat section 16 through bent connector section 11. IDC regions 9 are parallel to one another. Each IDC region 9 is able to make contact with an electrical connector of electric component 2. A secure electrical connection having a low contact resistance is achieved by the double contact. Flat section 16 is formed so that it can find a stable foothold in an insert slot 6 of housing 1. Press-fit contacts 8 are integrally molded on the side of flat section 16 opposite bent connector section 11.

The opening directions of IDC regions 9 are oriented parallel to the direction of extension of press-fit contacts 8. IDC regions 9 make contact with an electrical connector of component 2 at the same time during introduction of IDC 4 into insert slot 6 of housing 1. Concurrently, press-fit contacts 8 make contact in corresponding interlayer connections of the PCB. As a result, component 2 and the PCB are electrically connected to one another via the electrical connector of component 2 and IDC 4. Contacting and the electrical connection of the electrical connector of component 2 and the PCB occur simply in a single operational step. The single operational step being insertion of IDC 4 into insert slot 6 of housing 1.

Along with the solder-free electrical connection of component 2 to the PCB, a mechanical connection between housing 1 and the PCB can be made concurrently by the connection between press-fit contacts 8 of IDC 4 and the PCB.

Figure 5:
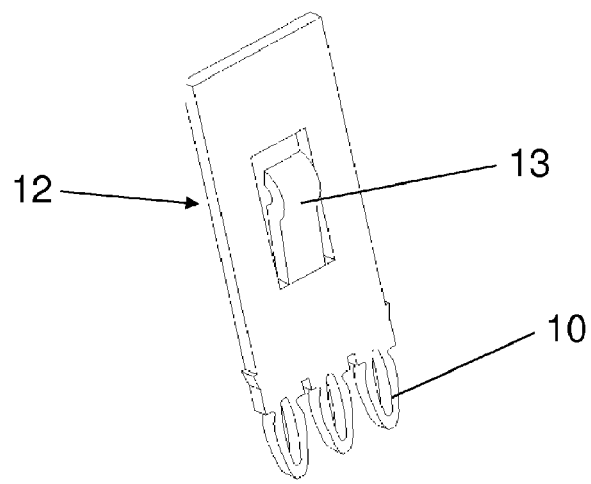
FIG. 5 illustrates a perspective view of a flat pin connector of the electrical appliance.

With reference to FIGS. 3 and 5, the electrical appliance may further include at least one flat pin connector 12 for fastening the PCB to housing 1. Pin connector 12 includes a plurality of molded press-fit contacts 10 for binding to the PCB. Pin connector 12 further includes a molded spring 13. Spring 13 protrudes outwardly from the plane of pin connector 12. Spring 13 serves to secure pin connector 12 in an insert slot of housing 1. Pin connector 12 can have an electrical function and for example can contact the surface shell of component 2 inserted into holding chamber 3. Alternatively, pin connector 12 can serve mainly as an additional attachment of the PCB to housing 1.

REFERENCE NUMBERS 1 housing
2 electrical component
3 holding chamber
4 insulation displacement connector (IDC)
5 latching clip
6 insert slot
7 protrusion
8 press-fit contact
9 IDC region
10 press-fit contact
11 connector section
12 flat pin connector
13 spring
14 actuating bevel
15 housing base
16 flat section While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. An electrical appliance comprising:
an insulation displacement connector; and
a housing having a holding chamber and an insert slot, wherein the holding chamber is configured to receive an electrical component axially inserted through an opening of the holding chamber into the holding chamber for holding the electrical component to the housing, wherein the insert slot is configured to receive the insulation displacement connector for holding the insulation displacement connector to the housing;
wherein the holding chamber is further configured to completely surround, at least in sections, an electrical component received in the holding chamber such that the holding chamber prevents an electrical component received in the holding chamber from radially exiting out from the holding chamber and prevents an electrical component from being radially inserted into the holding chamber while enabling an electrical component to be axially inserted through the opening of the holding chamber into the holding chamber;
wherein the holding chamber further includes a radially-pivotable latching clip at the opening of the holding chamber, wherein the latching clip radially projects into the holding chamber and axially fixes in place an electrical component received in the holding chamber;
wherein the insulation displacement connector is configured to electrically contact both of an electric connector of an electrical component received in the housing and a printed circuit board mounted to the housing upon insertion of the insulation displacement connector into the insert slot.

2. The electrical appliance of claim 1 wherein:
the holding chamber is configured to enclose the entire axial extent of an electrical component received by the holding chamber.

3. The electrical appliance of claim 1 wherein:
the holding chamber includes a protrusion that projects into the holding chamber and is configured to press elastically against the outer surface of an electrical component received in the holding chamber.

4. The electrical appliance of claim 1 wherein:
the latching clip has an actuating bevel, the actuating bevel increases in height in the direction of the holding chamber on which an electrical component is guided during axial insertion into the holding chamber.

5. The electrical appliance of claim 1 wherein:
the holding chamber has an aperture, wherein the aperture is configured to enable an electric connector of an electrical component received in the holding chamber to extend through the aperture such that the electric connector can extend into the region of the insert slot.

6. The electrical appliance of claim 1 wherein:
the insulation displacement connector includes two connector regions that are parallel to one another, wherein the connector regions are configured to make the electrical contact with an electric connector of an electrical component received in the housing.

7. The electrical appliance of claim 6 wherein:
the insulation displacement connector further includes a press-fit contact, wherein the press-fit contact is configured to make the electrical contact with a printed circuit board mounted to the housing.

8. The electrical appliance of claim 7 wherein:
the opening direction of the two connector regions of the insulation displacement connector is parallel to the direction of extension of the press-fit contact.

9. The electrical appliance of claim 1 further comprising:
a flat pin connector that is attachable to the housing, wherein the flat pin connector includes a press-fit contact that can be connected to a printed circuit board mounted to the housing.

10. The electrical appliance of claim 9 wherein:
the flat pin connector has a projecting spring.

11. The electrical appliance of claim 1 wherein:
the electrical component is an electric storage element.

12. The electrical appliance of claim 1 wherein:
the holding chamber is an elastically deformable body.

13. An electrical appliance comprising:
a housing having a holding chamber and an insert slot;
an insulation displacement connector; and
an electrical component axially inserted through an opening of the holding chamber into the holding chamber, the electrical component having an electric connector extending through an aperture of the holding chamber into the region of the insert slot;
wherein upon insertion of the insulation displacement connector into the insert slot, the insulation displacement connector contacts the electric connector of the electrical component and contacts a printed circuit board mounted to the housing whereby the electrical component and the printed circuit board are electrically connected via the electric connector of the electrical component and the insulation displacement connector;
wherein the holding chamber completely surrounds, at least in sections, the electrical component within the holding chamber such that the holding chamber prevents the electrical component within the holding chamber from radially exiting out from the holding chamber and prevents an electrical component from being radially inserted into the holding chamber while enabling the electrical component within the holding chamber to be axially inserted through the opening into the holding chamber;
wherein the holding chamber includes a radially-pivotable latching clip at the opening of the holding chamber, wherein the latching clip radially projects into the holding chamber and axially fixes in place the electrical component within the holding chamber;
wherein the holding chamber is configured to prevent the electrical component from being radially inserted into the holding chamber.

14. The electrical appliance of claim 13 wherein:
the holding chamber includes a protrusion that projects into the holding chamber, wherein the protrusion presses elastically against the electrical component within the holding chamber.

15. The electrical appliance of claim 13 wherein:
the latching clip has an actuating bevel, wherein the actuating bevel increases in height in the direction of the holding chamber on which the electrical component is guided during axial insertion into the holding chamber.

16. The electrical appliance of claim 13 wherein:
the insulation displacement connector includes two connector regions that are parallel to one another, wherein the connector regions make the contact with the electric connector of the electrical component within the housing.

17. The electrical appliance of claim 16 wherein:
the insulation displacement connector further includes a press-fit contact, wherein the press-fit contact makes the contact with the printed circuit board.

18. The electrical appliance of claim 17 wherein:
the opening direction of the two connector regions of the insulation displacement connector is parallel to the direction of extension of the press-fit contact.

19. The electrical appliance of claim 13 further comprising:
a flat pin connector that is attachable to the housing, wherein the flat pin connector includes a press-fit contact that can be connected to the printed circuit board.

* * * * *